US007205086B2

(12) United States Patent
Berger et al.

(10) Patent No.: US 7,205,086 B2
(45) Date of Patent: *Apr. 17, 2007

(54) MULTILAYER ELEMENTS CONTAINING PHOTORESIST COMPOSITIONS AND THEIR USE IN MICROLITHOGRAPHY

(75) Inventors: Larry L. Berger, Chadds Ford, PA (US); Frank L. Schadt, III, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 272 days.

This patent is subject to a terminal disclaimer.

(21) Appl. No.: 10/398,872

(22) PCT Filed: Nov. 26, 2001

(86) PCT No.: PCT/US01/44295

§ 371 (c)(1),
(2), (4) Date: Apr. 9, 2003

(87) PCT Pub. No.: WO02/44815

PCT Pub. Date: Jun. 6, 2002

(65) Prior Publication Data

US 2004/0038151 A1 Feb. 26, 2004

(51) Int. Cl.
*G03F 7/004* (2006.01)
*G03F 7/03* (2006.01)

(52) U.S. Cl. .......... 430/270.1; 430/326; 430/905; 430/907; 430/910

(58) Field of Classification Search ........ 430/270.1, 430/905, 907, 910, 317, 323, 326; 403/907
See application file for complete search history.

(56) References Cited

U.S. PATENT DOCUMENTS

| | | | |
|---|---|---|---|
| 4,908,298 A * | 3/1990 | Hefferon et al. ......... 430/313 |
| 5,912,095 A * | 6/1999 | Katakura ............... 430/5 |
| 6,187,211 B1 * | 2/2001 | Smith et al. ........... 216/26 |
| 6,306,560 B1 * | 10/2001 | Wang et al. ........... 430/316 |
| 6,461,791 B1 * | 10/2002 | Hatakeyama et al. ... 430/270.1 |
| 6,503,686 B1 * | 1/2003 | Fryd et al. ........... 430/270.1 |
| 6,764,809 B2 * | 7/2004 | DeSimone et al. ...... 430/313 |

FOREIGN PATENT DOCUMENTS

| | | | |
|---|---|---|---|
| EP | 789278 | * | 8/1997 |
| WO | WO-0017712 | * | 3/2000 |

* cited by examiner

*Primary Examiner*—John S. Chu

(57) ABSTRACT

A photoresist element comprising a substrate; an etch resistant layer; and at least one photoresist layer prepared from a photoresist composition comprising a polymer selected from the group consisting of: (a) a fluorine-containing copolymer comprising a repeat unit derived from at least one ethylenically unsaturated compound characterized in that at least one ethylenically unsaturated compound is polycyclic; (b) a branched polymer containing protected acid groups, said polymer comprising one or more branch segment(s) chemically linked along a linear backbone segment; (c) fluoropolymers having at least one fluoroalcohol group having the structure: —$C(R_f)(R_f')OH$, wherein $R_f$ and $R_f'$ are the same or different fluoroalkyl groups of from 1 to about 10 carbon atoms or taken together are $(CF_2)n$ wherein n is 2 to 10; (d) amorphous vinyl homopolymers of perfluoro(2,2-dimethyl-1,3-dioxole) or $CX_2=CY_2$ where X=F or $CF_3$ and Y=—H or amorphous vinyl copolymers of perfluoro (2,2-dimethyl-1,3-dioxole) and $CX_2=CY_2$; and (e) nitrile/fluoroalcohol-containing polymers prepared from substituted or unsubstituted vinyl ethers; and (B) at least one photoactive component.

24 Claims, No Drawings

MULTILAYER ELEMENTS CONTAINING PHOTORESIST COMPOSITIONS AND THEIR USE IN MICROLITHOGRAPHY

FIELD OF THE INVENTION

The present invention pertains to photoimaging and, in particular, the use of photoresists (positive-working and/or negative-working) for imaging in the production of semiconductor devices. The present invention also pertains polymer compositions having high UV transparency (particularly at short wavelengths, e.g., 157 nm) which are useful in multilayer elements.

BACKGROUND OF THE INVENTION

Optical microlithography is the process in semiconductor manufacturing in which chip designs are patterned onto silicon wafers. Currently, the semiconductor industry uses tools with a light wavelength of 248 nm from a KrF excimer laser to create chips with feature sizes as small as 180 nm. The next state of the art technology will make use of 193 nm light from an ArF laser, and is expected to extend optical lithography to chip features as small as 100 nm.

Although it is assumed that some non-optical lithography (X-ray, extreme ultraviolet, electron-beam, etc.) will ultimately replace optical lithography, no such technology is expected to be ready within the next decade. Thus, interest in 157 nm lithography has exploded in recent months, and it is now viewed as a critical bridge across the gap between optical and non-optical lithographies. Development of technology using 157 nm light from a $F_2$ laser will extend the use of optical lithography to at least the 70 nm node.

The imaging layer used in microlithography is a photoresist, which must be nearly transparent to the wavelength of light employed. The basic requirements for a single layer resist also include good plasma etch resistance, high $T_g$, compatibility with conventional aqueous base developer, and imaging with favorable development/dissolution characteristics. Alternatively, etch resistance can be provided by the substrate on which the photoresist is coated (sometimes referred to as a "hard mask"). This strategy is utilized when the opacity of the resist precludes using it as a thick, single layer resist.

A need exists for bilayer or multilayer resists that are suitable for 157 nm imaging.

SUMMARY OF THE INVENTION

In a first aspect, the invention provides a photoresist element comprising:

(L) a substrate;

(M) an etch resistant layer; and (N) at least one photoresist layer prepared from a photoresist composition comprising:

(A) at least one polymer selected from the group consisting of:

(a) a fluorine-containing copolymer comprising a repeat unit derived from at least one ethylenically unsaturated compound characterized in that at least one ethylenically unsaturated compound is polycyclic;

(b) a branched polymer containing protected acid groups, said polymer comprising one or more branch segment(s) chemically linked along a linear backbone segment;

(c) a fluoropolymer having at least one fluoroalcohol group having the structure:

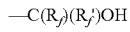

wherein $R_f$ and $R_f'$ are the same or different fluoroalkyl groups of from 1 to about 10 carbon atoms or taken together are $(CF_2)_n$ wherein n is 2 to 10;

(d) an amorphous vinyl homopolymer of perfluoro(2,2-dimethyl-1,3-dioxole) or $CX_2=CY_2$ where X=F or $CF_3$ and Y=—H or amorphous vinyl copolymers of perfluoro(2,2-dimethyl-1,3-dioxole) and $CX_2=CY_2$; and (e) a nitrile/fluoroalcohol-containing polymer prepared from substituted or unsubstituted vinyl ethers; and (B) at least one photoactive component. Typically, the polymer in the blend have an absorption coefficient of less than $5.0\ \mu m^{-1}$ at a wavelength of 157 nm.

In a second aspect, the invention provides a process for preparing a photoresist image on a substrate comprising, in order:

(X) imagewise exposing a photoresist element to form imaged and non-imaged areas, wherein the photoresist element comprises a substrate; an etch resistant layer; and at least one photoresist layer prepared from a photoresist composition comprising:

(A) a polymer selected from (a)–(e) described above, and mixtures thereof; and (B) a photoactive component; and (Y) developing the exposed photoresist layer having imaged and non-imaged areas to form the relief image on the substrate.

DETAILED DESCRIPTION OF THE INVENTION

The photoresist element comprises a support, an etch resistant layer and at least one photoresist layer; wherein the photoresist layer is prepared from a photoresist composition comprises a polymer selected from the group consisting of (a) to (e), and mixtures thereof; and a photoactive component.

Substrate

The substrate employed in this invention can illustratively be silicon, silicon oxide, silicon nitride, or various other materials used in semiconductive manufacture.

Etch Resistant Layer:

The etch resistant layer may be selected from a wide variety of known materials. These materials are sometimes referred to as hard masks. Some suitable materials include inorganic materials such as silicon oxide, silicon nitride, silicon oxy nitride, etc. These materials may be applied to the substrate by any conventional means. For example, chemical vapor deposition (CVD) may be used to apply the etch resistant layer to the substrate.

Photoresist Layer:

The photoresist layer comprises a polymer and a photoactive component.

The polymers are useful in photoresist compositions\for semiconductor lithography. In particular, since low optical absorption below 193 nm is a prime attribute of the materials of this invention, they should be of particularly utility at this wavelength. The polymers are not required to but may have an absorption coefficient of less than about $5.0\ \mu m^{-1}$ at a wavelength of about 157 nm, typically less than about 4.0 μm⁻¹ at this wavelength, and, more typically, less than about 3.5 μm⁻¹ at this wavelength.

(A) The Polymer:

The fluorine-containing copolymer (a) comprises a repeat unit derived from at least one ethylenically unsaturated compound characterized in that the at least one ethylenically unsaturated compound is polycyclic. Copolymer (a) is selected from the group consisting of:

(a1) a fluorine-containing copolymer comprising a repeat unit derived from at least one ethylenically unsaturated compound characterized in that at least one ethylenically unsaturated compound is polycyclic and at least one other ethylenically unsaturated compound contains at least one fluorine atom covalently attached to an ethylenically unsaturated carbon atom; and (a2) a fluorine-containing copolymer comprising a repeat unit derived from at least one polycyclic ethylenically unsaturated compound containing at least one of a fluorine atom, perfluoroalkyl group, and perfluoroalkoxy group which is covalently attached to a carbon atom which is contained within a ring structure and separated from each ethylenically unsaturated carbon atom of the ethylenically unsaturated compound by at least one covalently attached carbon atom.

The at least one ethylenically unsaturated compound disclosed in (a1) may selected from the group consisting of:

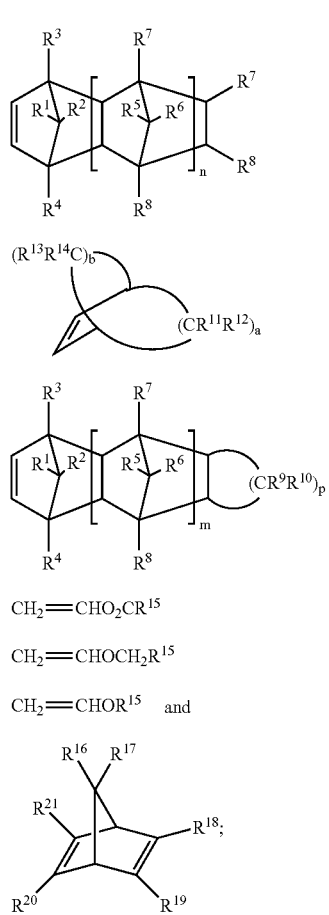

wherein:
each of m and n is 0, 1 or 2, p is an integer of at least 3; a and b are independently 1 to 3 except that a is not=1 when b=2 or vice versa;

$R^1$ to $R^{14}$ are the same or different and each represents a hydrogen atom, a halogen atom, a hydrocarbon group containing 1 to 14 carbon atoms, typically 1 to 10 carbon atoms optionally substituted with at least one O, N, S, P or halogen atom for example a carboxyl group such as a secondary or tertiary alkyl carboxylic acid group or carboxylic ester group;

$R^{15}$ is a saturated alkyl group of about 4 to 20 carbon atoms, optionally containing one or more ether oxygens with the proviso that the ratio of carbon atoms to hydrogen atoms is greater than or equal to 0.58;

$R^{16}$ to $R^{21}$ are each independently hydrogen atoms, $C_1$ to $C_{12}$ alkyls, $(CH_2)_qCO_2A$, $CO_2(CH_2)_qCO_2A$ or $CO_2A$ wherein q is 1 to 12 and A is hydrogen or an acid protecting group with the proviso that at least one of $R^{18}$ to $R^{21}$ is $CO_2A$.

A key characteristic of the copolymers (and photoresists comprised of the copolymers) of this invention is the cooperative combination of polycyclic repeat unit(s) with the same or different repeat units that are fluorine containing and, furthermore, with all repeat units in the copolymers not containing aromatic functionality. The presence of polycyclic repeat units in the copolymers is important in order for the copolymers to possess high resistance to plasma etching (e.g., reactive ion etching). Polycyclic repeat units also tend to provide a high glass transition temperature which is important for maintaining dimensional stability in the resist films. The presence of repeat units that are fluorine-containing is important in order for the copolymers to possess high optical transparency, i.e., to have low optical absorptions in the extreme and far UV. The absence of aromatic functionality in the repeat units of the copolymers is also required in order for the polymers to possess high optical transparency.

In certain embodiments of this invention, the fluorine-containing copolymer may be comprised of a repeat unit derived from at least one polycyclic ethylenically unsaturated compound having at least one atom or group selected from the group consisting of fluorine atom, perfluoroalkyl group, and perfluoroalkoxy group, covalently attached to a carbon atom which is contained within a ring structure. Fluorine atoms, perfluoroalkyl groups and perfluoroalkoxy groups tend to inhibit polymerization of cyclic ethylenically unsaturated compounds by metal-catalyzed addition polymerization or metathesis polymerization when such groups are attached directly to an ethylenically unsaturated carbon atom. Thus, it is important in such cases that the at least one fluorine atom, perfluoroalkyl group and perfluoroalkoxy group be separated from each ethylenically unsaturated carbon atom of the ethylenically unsaturated compound by at least one covalently attached carbon atom. Furthermore, attaching the atom and/or group directly to a ring minimizes the presence of undesirable non-fluorinated aliphatic carbon atoms.

The copolymers of this invention surprisingly have balanced properties that are important for imparting necessary properties to photoresist compositions for semiconductor applications. First, these copolymers have unexpectedly low optical absorptions in the extreme and far UV, including 193 nm and 157 nm wavelengths. Having copolymers with low optical absorptions is important for formulating high photo-speed resists wherein the major amount of UV light is absorbed by the photoactive component(s) and not lost due to absorption by the copolymer (matrix of the resist). Second, resists comprising the fluorine-containing polymers of this invention desirably exhibit very low plasma etch rates. This latter property is important in affording high resolution precision resists that are required in semiconductor fabrication. Achieving simultaneously suitable values of these properties is particularly important for imaging at 157 nm. In this case, ultra thin resists are needed for high resolution, but these thin resists must nevertheless be highly etch resistant such that resist remains on imaged substrates and protects areas of underlying substrate during etching.

In the preferred embodiments of this invention, the photoresist composition comprises copolymers that comprise a repeat unit derived from at least one polycyclic comonomer (i.e., a comonomer comprising at least two rings, e.g., norbornene). This is important for three main reasons: 1) polycyclic monomers have relatively high carbon to hydrogen ratios (C:H), which results in base polymers comprised of repeat units of these polycyclic monomers generally having good plasma etch resistance; 2) polymers having repeat units derived from polycyclic monomers, which preferably can be fully saturated upon polymerization, generally have good transparency characteristics; and 3) polymers prepared from polycyclic monomers usually have relatively high glass transition temperatures for improved dimensional stability during processing. The ethylenically unsaturated group may be contained within the polycyclic moiety as in norbornene or may be pendant to the polycyclic moiety as in 1-adamantane carboxylate vinyl ester. A polymer comprised of repeat units derived from polycyclic comonomers, having high C:H ratios, has a relatively low Ohnishi number (O.N.), where:

O. N.=$N/(N_c-N_o)$ with N being the number of atoms in the repeat unit of the polymer, $N_c$ being the number of carbon atoms in the repeat unit of the polymer, and $N_o$ being the number of oxygen atoms in the repeat unit of the polymer. There is an empirical law discovered by Ohnishi et al. (*J. Electrochem. Soc., Solid-State Sci. Technol.,* 130, 143 (1983) which states that the reactive ion etch (RIE) rate of polymers is a linear function of the Ohnishi number (O.N.). As one example, poly(norbornene) has formula poly($C_7H_{10}$) and the O.N.=17/7=2.42. Polymers comprised predominantly of carbon and hydrogen having polycyclic moieties and relatively little functionality containing oxygen will have relatively low O.N.s and will, according to the empirical law of Ohnishi, have corresponding low (in an approximate linear manner) RIE rates.

As is well known to those skilled in the polymer art, an ethylenically unsaturated compound undergoes free radical polymerization to afford a polymer having a repeat unit that is derived from the ethylenically unsaturated compound. Specifically, an ethylenically unsaturated compound having structure:

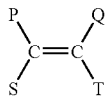

that undergoes free radical polymerization will afford a polymer having a repeat unit:

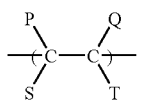

where P, Q, S, and T independently can represent, but are not limited to, H, F, Cl, Br, an alkyl group containing 1 to 14 carbon atoms, aryl, aralkyl group containing 6 to 14 carbon atoms or a cycloalkyl group containing 3 to 14 carbon atoms.

If only one ethylenically unsaturated compound undergoes polymerization, the resulting polymer is a homopolymer. If two or more distinct ethylenically unsaturated compounds undergo polymerization, the resulting polymer is a copolymer.

Some representative examples of ethylenically unsaturated compounds and their corresponding repeat units are given below:

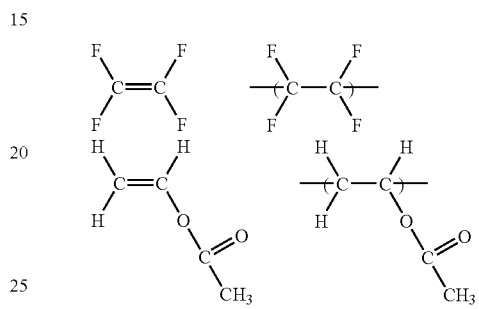

In the sections that follow, the photoresist compositions of this invention are described in terms of their component parts.

The photoresists of this invention comprise a fluorine-containing copolymer comprising a repeat unit derived from at least one ethylenically unsaturated compound characterized in that at least one ethylenically unsaturated compound is polycyclic and at least one ethylenically unsaturated compound contains at least one fluorine atom covalently attached to an ethylenically unsaturated carbon atom. Representative ethylenically unsaturated compounds that are suitable for the fluorine-containing copolymers of this invention include, but are not limited to, tetrafluoroethylene, chlorotrifluoroethylene, hexafluoropropylene, trifluoroethylene, vinylidene fluoride, vinyl fluoride, perfluoro-(2,2-dimethyl-1,3-dioxole), perfluoro-(2-methylene-4-methyl-1, 3-dioxolane, $CF_2$=$CFO(CF_2)_tCF$=$CF_2$, where t is 1 or 2, and $R_fOCF$=$CF_2$ wherein $R_f$ is a saturated fluoroalkyl group of from 1 to about 10 carbon atoms. The fluorine-containing copolymers of this invention can be comprised of any integral number of additional fluorine-containing comonomers, which include, but are not limited to, those listed supra. Preferred comonomers are tetrafluoroethylene, chlorotrifluoroethylene, hexafluoropropylene, trifluoroethylene and $R_fOCF$=$CF_2$, wherein $R_f$ is a saturated fluoroalkyl group of from 1 to about 10 carbon atoms. More preferred comonomers are tetrafluoroethylene, chlorotrifluoroethylene, hexafluoropropylene, and $R_fOCF$=$CF_2$, wherein $R_f$ is a saturated perfluoroalkyl group of from 1 to about 10 carbon atoms. Most preferred comonomers are tetrafluoroethylene and chlorotrifluoroethylene.

Representative comonomers having structure H include, but are not limited to:

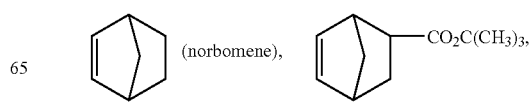

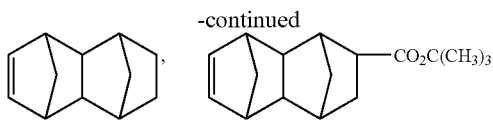

Representative comonomers having structure I include, but are not limited to:

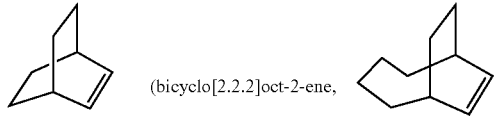

(bicyclo[2.2.2]oct-2-ene,

Representative comonomers having structure J include, but are not limited to:

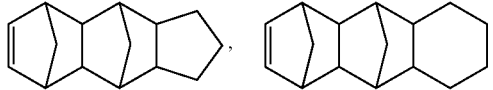

Representative comonomers having structure K include, but are not limited to:

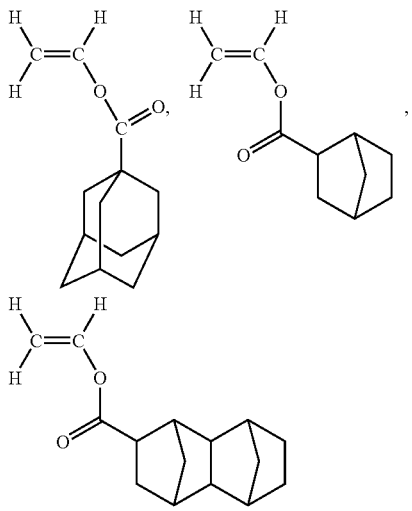

Representative comonomers having structure L include, but are not limited to:

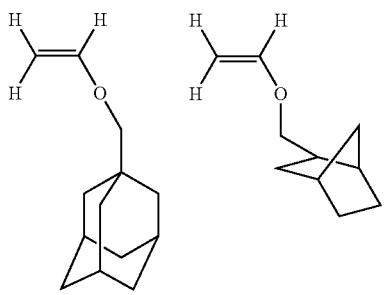

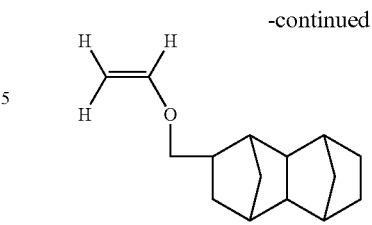

Representative comonomers having structure M include, but are not limited to:

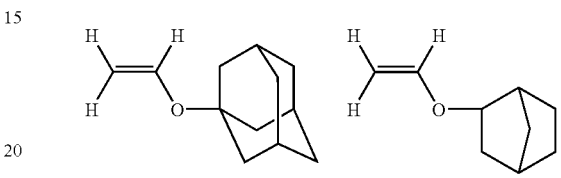

All of the inventive copolymers comprising comonomers having structures K, L and M are characterized as comprising fluorinated olefins and vinyl esters of formula $CH_2=CHO_2CR^{22}$ or vinyl ethers of formulae $CH_2=CHOCH_2R^{22}$ or $CH_2=CHOR^{22}$, wherein $R^{22}$ are hydrocarbon groups of about 4 to 20 carbon atoms with a C:H ratio that is relatively high and which is greater than 0.58 since a high C:H ratio corresponds to good plasma etch resistance. (This is in contrast to copolymers comprising fluorinated olefins and vinyl esters of formula $CH_2=CHO_2CR^{23}$ or vinyl ethers of formulae $CH_2=CHOCH_2R^{23}$ or $CH_2=CHOR^{23}$, wherein $R^{23}$ has a C:H ratio that is relatively low and which is less than 0.58. $R^{22}$ and $R^{23}$ are selected from alkyl, aryl, aralkyl, and cycloalkyl.

Representative comonomers having structure N include, but are not limited to:

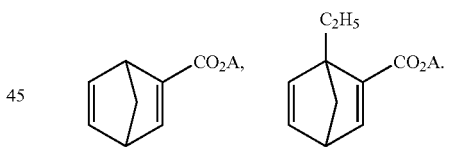

where A=H, $(CH_3)_3C$, $(CH_3)_3Si$.

In preferred embodiments described above having at least one unsaturated compound of structure H—N as the second recited comonomer, there is a limitation on the second comonomer if (and only if) the fluorine-containing copolymer is not comprised of additional comonomer(s) having functionality that is selected from a carboxylic acid and a protected acid group. In this case, the fluorine-containing copolymer has just two comonomers (the two recited comonomers and having no additional unrecited comonomers). In this case, there must be sufficient functionality that is selected from a carboxylic acid and a protected acid group present in the at least one unsaturated compound (i.e., the second recited comonomer) such that the photoresists of this invention that are comprised of the fluorine-containing polymer are developable upon imagewise exposure as explained in more detail infra. In these embodiments with the fluorine-containing copolymer having just two comonomers, the mole percentages of the two comonomers in the copolymer can range from 90%, 10% to 10%, 90% for the fluoromonomer (first recited monomer) and the second comonomer, respectively. Typically, the mole percentages of the two comonomers are in the range from 60%, 40% to 40%, 60% for the fluoromonomer (first recited monomer) and the second comonomer, respectively.

The fluorine-containing copolymers of this invention can be comprised of any integral number without limit of additional comonomers beyond the two recited comonomers (i.e., (i) at least one ethylenically unsaturated compound containing at least one fluorine atom covalently attached to an ethylenically unsaturated carbon atom; and (ii) at least one unsaturated compound selected from the group of structures H—N) for some embodiments. Representative additional comonomers can include, but are not limited to, acrylic acid, methacrylic acid, t-butyl acrylate, t-butyl methacrylate, t-amyl acrylate, t-amyl methacrylate, isobutyl acrylate, isobutyl methacrylate, ethylene, vinyl acetate, itaconic acid, and vinyl alcohol. In those embodiments where the fluorine-containing copolymer has two recited comonomers and is comprised of three or more comonomers, the mole percentage of the second recited comonomer (i.e., (ii) at least one unsaturated compound selected from the group of structures H—N) ranges from about 20 mole % to about 80 mole %, preferably ranges from about 30 mole % to about 70 mole %, more preferably ranges from about 40 mole % to about 70 mole %, and still most preferably is about 50 to about 70 mole %. Summation of the mole percentages of all other comonomers constituting the copolymer represents a balance that when added to the mole percentage of the second recited comonomer totals 100%. The sum of the mole percentages of all other comonomers present in the copolymer except for the second recited comonomer broadly is in the range from about 80 mole % to about 20 mole %. Preferably, the sum of the mole percentages of all other comonomers is in the range from about 70 mole % to about 30 mole %. More preferably, the sum of the mole percentages of all other comonomers is in the range from about 60 mole % to about 30 mole %, and, still more preferably, the sum of the mole percentages of all other comonomers is in the range from about 50 mole % to about 30 mole %. When the fluorine-containing polymer is a terpolymer, a suitable ratio of the fluoromonomer (first recited monomer) to the additional comonomer can broadly range from 5:95 to 95:5. When the fluorine-containing copolymer contains additional comonomers having functionality of acid groups or protected acid groups in sufficient amounts necessary for developability, the functionality can be present or absent in the second recited comonomer without limitation.

A given fluorine-containing copolymer, comprised of a repeat unit derived from a comonomer having at least one fluorine atom attached to an ethylenically unsaturated carbon atom, of the photoresist composition(s) of this invention can be prepared by free radical polymerization. Polymers may be prepared by bulk, solution, suspension or emulsion polymerization techniques known to those skilled in the art using free radical initiators, such as azo compounds or peroxides.

A given fluorine-containing copolymer, containing only repeat units derived from all cyclic comonomers and totally lacking a repeat unit derived from a comonomer that has one or more fluorine atom(s) attached to an ethylenically unsaturated carbon atom(s), of the photoresist composition(s) of this invention can also be prepared by free radical polymerization, but in addition can be prepared by other polymerization methods, including vinyl-addition polymerization and ring-opening methathesis polymerization (ROMP). Both of the latter polymerization methods are known to those skilled in the art. Vinyl-addition polymerization using nickel and palladium catalysts is disclosed in the following references: 1) Okoroanyanwu U.; Shimokawa, T.; Byers, J. D.; Willson, C. G. *J. Mol. Catal. A: Chemical* 1998, 133, 93; 2) PCT WO 97/33198 (Sep. 12, 1997) assigned to B. F. Goodrich; 3) Reinmuth, A.; Mathew, J. P.; Melia, J.; Risse, W. *Macromol. Rapid Commun.* 1996, 17, 173; and 4) Breunig, S.; Risse, W. *Makromol. Chem.* 1992, 193, 2915.Ring-opening metathesis polymerization is disclosed in references 1) and 2) supra using ruthenium and irridium catalysts; and also in 5) Schwab, P.; Grubbs, R. H.; Ziller, J. W. *J. Am. Chem. Soc.* 1996, 118, 100; and 6) Schwab, P.; France, M. B.; Ziller, J. W.; Grubbs, R. H. Angew. *Chem. Int. Ed. Engl.* 1995, 34, 2039.

Some of the fluorine-containing bipolymers of the resist compositions of this invention, where the bipolymer contains a fluoromonomer (e.g., TFE) and a cyclic olefin (e.g., norbornene) appear to be alternating or approximately alternating bipolymers having a structure, but not limited to, the one shown below:

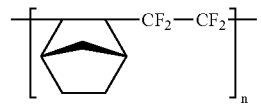

In such cases, the invention includes these alternating or approximately alternating copolymers but is not in any manner limited to just alternating copolymer structures.

These polymers are described in WO 00/17712 published on Mar. 20, 2000.

The polymer (b) is a branched polymer containing protected acid groups, said polymer comprising one or more branch segment(s) chemically linked along a linear backbone segment. The branched polymer can be formed during free radical addition polymerization of at least one ethylenically unsaturated macromer component and at least one ethylenically unsaturated comonomer. The ethylenically unsaturated macromer component has a number average molecular weight ($M_n$) between a few hundred and 40,000 and the linear backbone segment resulting from the polymerization has a number average molecular weight ($M_n$) between about 2,000 and about 500,000. The weight ratio of the linear backbone segment to the branch segment(s) is within a range of about 50/1 to about 1/10, and preferably within the range of about 80/20 to about 60/40. Typically the macromer component has a number average molecular weight ($M_n$) from 500 to about 40,000 and more typically of about 1,000 to about 15,000. Typically such an ethylenically unsaturated macromer component can have a number average molecular weight ($M_n$) equivalent to there being from about 2 to about 500 monomer units used to form the macromer component and typically between 30 and 200 monomer units.

In a typical embodiment, the branched polymer contains from 25% to 100% by weight of compatibilizing groups, i.e., functional groups present to increase compatibility with the photoacid generator, preferably from about 50% to 100% by weight, and more preferably from about 75% to 100% by weight. Suitable compatibilizing groups for ionic photoacid generators include, but are not limited to, both non-hydrophilic polar groups and hydrophilic polar groups. Suitable non-hydrophilic polar groups include, but are not limited to, cyano (—CN) and nitro (—NO$_2$). Suitable hydrophilic polar groups include, but are not limited to protic groups such as hydroxy (OH), amino (NH$_2$), ammonium, amido, imido, urethane, ureido, or mercapto; or carboxylic (CO$_2$H), sulfonic, sulfinic, phosphoric, or phosphoric acids or salts thereof. Preferably, compatibilizing groups are present in the branch segment(s).

Typically, the protected acid groups (described infra) produce carboxylic acid groups after exposure to UV or other actinic radiation and subsequent post-exposure baking (i.e., during deprotection). The branched polymer present in the photosensitive compositions of this invention, typically will contain between about 3% to about 40% by weight of monomer units containing protected acid groups, preferably between about 5% to about 50%, and more preferably between about 5% to about 20%. The branch segments of such a preferred branched polymer typically contain between 35% to 100% of the protected acid groups present. Such a branched polymer when completely unprotected (all protected acid groups converted to free acid groups) has an acid number between about 20 and about 500, preferably between about 30 and about 330, and more preferably between about 30 and about 130, and analogously the ethylenically unsaturated macromer component preferably has an acid number of about 20 and about 650, more preferably between about 90 and about 300 and the majority of the free acid groups are in the branch segments.

Each photosensitive composition of this aspect of the invention contains a branched polymer, also known as a comb polymer, which contains protected acid groups. The branched polymer has branch segments, known as polymer arms, of limited molecular weight and limited weight ratio relative to a linear backbone segment. In a preferred embodiment, a majority of the protected acid groups are present in the branch segments. The composition also contains a component, such as a photoacid generator, which renders the composition reactive to radiant energy, especially to radiant energy in the ultraviolet region of the electromagnetic spectrum and most especially in the far or extreme ultraviolet region.

In a specific embodiment, the branched polymer comprises one or more branch segments chemically linked along a linear backbone segment wherein the branched polymers have a number average molecular weight ($M_n$) of about 500 to 40,000. The branched polymer contains at least 0.5% by weight of branch segments. The branch segments, also known as polymer arms, typically are randomly distributed along the linear backbone segment. The "polymer arm" or branch segment is a polymer or oligomer of at least two repeating monomer units, which is attached to the linear backbone segment by a covalent bond. The branch segment, or polymer arm, can be incorporated into the branched polymer as a macromer component, during the addition polymerization process of a macromer and a comonomer. A "macromer" for the purpose of this invention, is a polymer, copolymer or oligomer of molecular weight ranging from several hundred to about 40,000 containing a terminal ethylenically unsaturated polymerizable group. Preferably the macromer is a linear polymer or copolymer end capped with an ethylenic group. Typically, the branched polymer is a copolymer bearing one or more polymer arms, and preferably at least two polymer arms, and is characterized in that between about 0.5 and about 80 weight %, preferably between about 5 and 50 weight % of the monomeric components used in the polymerization process is a macromer. Typically, comonomer components used along with the macromer in the polymerization process likewise contain a single ethylenic group that can copolymerize with the ethylenically unsaturated macromer.

The ethylenically unsaturated macromer and the resulting branch segment of the branched polymer, and/or the backbone of the branched polymer, can have bonded thereto one or more protected acid groups. For the purposes of this invention, a "protected acid group" means a functional group which, when deprotected, affords free acid functionality that enhances the solubility, swellability, or dispersibility in aqueous environments, of the macromer and/or the branched polymer to which it is bonded. The protected acid group may be incorporated into the ethylenically unsaturated macromer and the resulting branch segment of the branched polymer, and/or the backbone of the branched polymer, either during or after their formation. While addition polymerization using a macromer and at least one ethylenically unsaturated monomer is preferred for forming the branched polymer, all known methods of preparing branched polymers using either addition or condensation reactions can be utilized in this invention. Furthermore, use of either preformed backbones and branch segments or in situ polymerized segments are also applicable to this invention.

The branch segments attached to the linear backbone segment can be derived from ethylenically unsaturated macromers prepared according to the general descriptions in U.S. Pat. No. 4,680,352 and U.S. Pat. No. 4,694,054. Macromers are prepared by free radical polymerization processes employing a cobalt compound as a catalytic chain transfer agent and particularly a cobalt(II) compound. The cobalt(II) compound may be a pentacyanocobalt(II) compound or a cobalt(II) chelate of a vicinal iminobydroxyimino compound, a dihydroxyimino compound, a diazadihydroxyimninodialkyldecadiene, a diazadihydroxyimnino-dialkylundecadiene, a tetraazatetraalkylcyclotetradecatetraene, a tetraazatetraalkylcyclotedodecatetraene, a bis(difluoroboryl)diphenyl glyoximato, a bis(difluoroboryl)dimethyl glyoximato, a N,N'-bis(salicylidene)ethylenediamine, a dialkyldiaza-dioxodialkyldodecadiene, or a dialkyldiazadioxodialkyl-tridecadiene. Low molecular weight methacrylate macromers may also be prepared with a pentacyanocobalt(II) catalytic chain transfer agent as disclosed in U.S. Pat. No. 4,722,984.

Illustrative macromers using this approach are methacrylate polymers with acrylates or other vinyl monomers wherein the polymers or copolymers have a terminal ethylenic group and a hydrophilic functional group. Preferred monomer components for use in preparing macromers include: tertiary-butyl methacrylate (tBMA), tertiary-butyl acrylate (tBA), methyl methacrylate (MMA); ethyl methacrylate (EMA); butyl methacrylate (BMA); 2-ethylhexyl methacrylate; methyl acrylate (MA); ethyl acrylate (EA); butyl acrylate (BA); 2-ethylhexyl acrylate; 2-hydroxyethyl methacrylate (HEMA); 2-hydroxyethyl acrylate (HEA); methacrylic acid (MA); acrylic acid (AA); esters of acrylic and methacrylic acid wherein the ester group contains from 1 to 18 carbon atoms; nitriles and amides of acrylic and methacrylic acid (e.g., acrylonitrile); glycidyl methacrylate and acrylate; itaconic acid (IA) and itaconic acid anhydride (ITA), half ester and imide; maleic acid and maleic acid anhydride, half ester and imide; aminoethyl methacrylate; t-butyl aminoethyl methacrylate; dimethyl aminoethyl methacrylate; diethyl aminoethyl methacrylate; aminoethyl acrylate; dimethyl aminoethyl acrylate; diethyl aminoethyl acrylate; acrylamide; N-t-octyl acrylamide; vinyl methyl ether; styrene (STY); alpha-methyl styrene (AMS); vinyl acetate; vinyl chloride; and the like.

Itaconic acid anhydride (ITA, 2-methylenesuccinic anhydride, CAS No.=2170-03-8) is a particularly advantageous comonomer for use in the branched polymer since it has two active functional groups in the anhydride form, which become three upon ring opening to afford diacid. The ethylenically unsaturated moiety is a first functional group, which provides capability for this comonomer to be incorporated into a copolymer by, for example, free radical polymerization. The anhydride moiety is a second functional group that is capable of reacting with a variety of other functional groups to afford covalently bonded products. An example of a functional group that an anhydride moiety can react with is a hydroxy group in an alcohol to form an ester linkage. Upon reaction of the anhydride moiety of ITA with a hydroxy group, there is formed an ester linkage and a free carboxyic acid moiety, which is a third functional group. The carboxylic acid functional group is useful in imparting aqueous processability to the resists of this invention. If a PAG is utilized having a hydroxy group, it is possible, as illustrated in some of the examples, to covalently link (tether) a PAG (or other photoactive components) to a branched polymer comprised of ITA comonomer or the like via this type of ester linkage (or other covalent linkages, such as amide, etc.).

The branched polymer may be prepared by any conventional addition polymerization process. The branched polymer, or comb polymer, may be prepared from one or more compatible ethylenically unsaturated macromer components and one or more compatible, conventional ethylenically unsaturated comonomer component(s). Preferred addition polymerizable, ethylenically unsaturated comonomer components are acrylates, methacrylates, and styrenics as well as mixtures thereof. Suitable addition polymerizable, ethylenically unsaturated comonomer components include: tertiary-butyl methacrylate (tBMA), tertiary-butyl acrylate (tBA), methyl methacrylate (MMA); ethyl methacrylate (EMA); butyl methacrylate (BMA); 2-ethylhexyl methacrylate; methyl acrylate (MA); ethyl acrylate (EA); butyl acrylate (BA); 2-ethylhexyl acrylate; 2-hydroxyethyl methacrylate (HEMA); 2-hydroxyethyl acrylate (HEA); methacrylic acid (MAA); acrylic acid (AA); acrylonitrile (AN); methacrylonitrile (MAN); itaconic acid (IA) and itaconic acid anhydride (ITA), half ester and imide; maleic acid and maleic acid anhydride, half ester and imide; aminoethyl methacrylate; t-butyl aminoethyl methacrylate; dimethyl aminoethyl methacrylate; diethyl aminoethyl methacrylate; aminoethyl acrylate; dimethyl aminoethyl acrylate; diethyl aminoethyl acrylate; acrylamide; N-t-octyl acrylamide; vinyl methyl ethers; styrene (S); alpha-methyl styrene; vinyl acetate; vinyl chloride; and the like. The majority of the copolymerizable monomer must be acrylate or styrenic or copolymers of these monomers with acrylates and other vinyl monomers.

Each constituent linear backbone segment and/or branch segment of the branched polymer of this invention may contain a variety of functional groups. A "functional group" is considered to be any moiety capable of being attached to a backbone segment or a branch segment by a direct valence bond or by a linking group. Illustrative of functional groups which can be borne by the backbone segment or the branch segments are —COOR$^{24}$; —OR$^{24}$; —SR$^{24}$ wherein R$^{24}$ can be hydrogen, alkyl group having 1 to 12 carbon atoms; cycloalkyl group of 3–12 carbon atoms; aryl, alkaryl or aralkyl group having 6 to 14 carbon atoms; a heterocyclic group containing 3 to 12 carbon atoms and additionally containing an S, O, N or P atom; or —OR$^{27}$ where R$^{27}$ can be alkyl of 1–12 carbon atoms, aryl, alkaryl or aralkyl group having 6 to 14 carbon atoms; —CN; —N R$^{25}$R$^{26}$ or

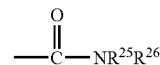

wherein R$^{25}$ and R$^{26}$ can be hydrogen, alkyl group having 1 to 12 carbon atoms; cycloalkyl group having of 3–12 carbon atoms; aryl, alkaryl, aralkyl of 6 to 14 carbon atoms; —CH$^2$OR$^{28}$ wherein R$^{28}$ is hydrogen, alkyl of 1 to 12 carbon atoms; or cycloalkyl of 3–12 carbon atoms, aryl, alkaryl, aralkyl having 6 to 14 carbon atoms, or together R$^{25}$ and R$^{26}$ can form a heterocyclic ring having 3 to 12 carbon atoms and containing at least one S, N, O or P;

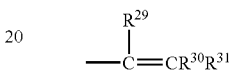

wherein R$^{29}$, R$^{30}$ and R$^{31}$ can be hydrogen, alkyl of 1 to 12 carbon atoms or cycloalkyl of 3–12 carbon atoms; aryl, alkaryl, aralkyl of 6 to 14 carbon atoms, or —COOR$^{24}$ or when taken together R$^{29}$, R$^{30}$ and/or R$^{31}$ can form a cyclic group; —SO$_3$H; a urethane group; an isocyanate or blocked isocyanate group; a urea group; an oxirane group; an aziridine group; a quinone diazide group; an azo group; an azide group; a diazonium group; an acetylacetoxy group; —Si R$^{32}$R$^{33}$R$^{34}$ wherein R$^{32}$, R$^{33}$ and R$^{34}$ can be alkyl having 1–12 carbon atoms or cycloalkyl of 3–12 carbon atoms or —OR$^{35}$ where R$^{35}$ is alkyl of 1–12 carbon atoms or cycloalkyl of 3–12 carbon atoms; aryl, alkaryl or aralkyl of 6 to 14 carbon atoms; or an —OSO$_3$R$^{36}$, —OPO$_2$R$^{36}$, —PO$_2$R$^{36}$, —PR$^{36}$R$^{37}$R$^{38}$, —OPOR$^{36}$, —SR$^{36}$R$^{37}$, or —N+R$^{36}$R$^{37}$R$^{38}$ group (where R$^{36}$, R$^{37}$, and R$^{38}$ can be hydrogen, alkyl of 1 to 12 carbon atoms or cycloalkyl of 3–12 carbon atoms; aryl, alkaryl or aralkyl of 6 to 14 carbon atoms; or a salt or onium salt of any of the foregoing. Preferred functional groups are —COON, —OH, —NH$_2$, an amide group, a vinyl group, a urethane group, an isocyanate group, a blocked isocyanate group or combinations thereof. Functional groups may be located anywhere on the branched polymer. However, it is sometimes desirable to choose comonomers which impart bulk polymer characteristics to the linear backbone segment of the branched polymer and macromers which impart physical and chemical functionality to the branch segments in addition to hydrophilicity, such as solubility, reactivity, and the like.

In certain preferred embodiments of this invention, the branched polymer contains functional groups that are compatible with the photoacid generator, said functional groups being distributed in the branched polymer such that 25 to 100% of the functional groups are present in the segment of the branched polymer containing a majority of the protected acid groups. These functional groups are desirable since having enhanced compatibility of the photoacid generator with the branched polymer segmented having the majority of protected acid groups results in higher photospeed and perhaps higher resolution and/or other desirable properties of resists comprised of these branched polymer(s) having these functional groups to promote compatibility. For an ionic PAG, such as a triarylsulfonium salt, functional groups that promote compatibility include, but are not limited to, polar non-hydrophilic groups (e.g., nitro or cyano) and polar hydrophilic groups (e.g., hydroxy, carboxyl). For a nonionic PAG, such as structure III infra, preferred functional groups for imparting compatibility are less polar than the polar groups listed above. For the latter case, suitable functional groups include, but are not limited to, groups which impart rather similar chemical and physical properties to those of the non-ionic PAG. As two specific examples, aromatic and perfluoroalkyl functional groups are effective in promoting compatibility of the branched polymer with a nonionic PAG, such as structure III given infra.

In some preferred embodiments, the branched polymer is an acrylic/methacrylic/styrenic copolymer being at least 60% by weight acrylate and having at least 60% of methacrylate repeat units present either in a first location or a second location, the first location being one of the segments (i.e., branch segment(s) or linear backbone segment), the second location being a segment different from the first location, wherein at least 60% of the acrylate repeat units are present in the second location.

In some embodiments, the branched polymer is a fluorine-containing graft copolymer comprising a repeat unit derived from at least one ethylenically unsaturated compound containing at least one fluorine atom covalently attached to an ethylenically unsaturated carbon atom. The repeat unit bearing at least one fluorine atom can be either in the linear polymer backbone segment or in the branch polymer segment(s); preferably, it is in the linear polymer backbone segment. Representative ethylenically unsaturated compounds that are suitable for the fluorine-containing graft copolymers of this invention include, but are not limited to, tetrafluoroethylene, chlorotrifluoroethylene, hexafluoropropylene, trifluoroethylene, vinylidene fluoride, vinyl fluoride, and $R_fOCF=CF_2$ wherein $R_f$ is a saturated perfluoroalkyl group of from 1 to about 10 carbon atoms. The fluorine-containing copolymers of this invention can be comprised of any integral number of additional fluorine-containing comonomers, which include, but are not limited to, those listed supra. Preferred comonomers are tetrafluoroethylene, chlorotrifluoroethylene, hexafluoropropylene, trifluoroethylene and $R_fOCF=CF_2$, wherein $R_f$ is a saturated perfluoroalkyl group of from 1 to about 10 carbon atoms. More preferred comonomers are tetrafluoroethylene, chlorotrifluoroethylene, hexafluoropropylene, and $R_fOCF=CF_2$, wherein $R_f$ is a saturated perfluoroalkyl group of from 1 to about 10 carbon atoms. Most preferred comonomers are tetrafluoroethylene and chlorotrifluoroethylene.

In some preferred embodiments, the fluorine-containing graft copolymer is further comprised of a repeat unit derived from at least one unsaturated compound selected from the group consisting of structures shown for polymer (a) above.

In one embodiment of this invention, a PAG is covalently linked (i.e., tethered) to the fluorine-containing graft copolymer to afford a photoresist.

In some preferred embodiments, the branched polymer is a fluorine-containing copolymer comprising a repeat unit derived from at least one ethylenically unsaturated compound containing a fluoroalcohol functional group having the structure:

—C(R$_f$)(R$_f'$)OH wherein $R_f$ and $R_f'$ are the same or different fluoroalkyl groups of from 1 to about 10 carbon atoms or taken together are $(CF_2)_n$ wherein n is 2 to 10.

A given fluorine-containing branched copolymer comprising a repeat unit derived from at least one ethylenically unsaturated compound containing a fluoroalcohol functional group according to this invention can have fluoroalkyl groups present as part of the fluoroalcohol functional group. These fluoroalkyl groups are designated as $R_f$ and $R_f'$, which can be partially fluorinated alkyl groups or fully fluorinated alkyl groups (i.e., perfluoroalkyl groups). Broadly, $R_f$ and $R_f'$ are the same or different fluoroalkyl groups of from 1 to about 10 carbon atoms or taken together are $(CF_2)_n$ wherein n is 2 to 10. (In the last sentence, the terms "taken together" indicate that $R_f$ and $R_f'$ are not separate, discrete fluorinated alkyl groups, but that together they form a ring structure such as is illustrated below in case of a 5-membered ring:

$R_f$ and $R_f'$ can be partially fluorinated alkyl groups without limit according to the invention except that there must be a sufficient degree of fluorination present to impart acidity to the hydroxyl (—OH) of the fluoroalcohol functional group, such that the hydroxyl proton is substantially removed in basic media, such as in aqueous sodium hydroxide solution or tetraalkylammonium hydroxide solution. In preferred cases according to the invention, there will be sufficient fluorine substitution present in the fluorinated alkyl groups of the fluoroalcohol functional group such that the hydroxyl group will have a pKa value as follows: 5<pKa<11. Preferably, $R_f$ and $R_f'$ are independently perfluoroalkyl group of 1 to 5 carbon atoms, and, most perferably, $R_f$ and $R_f'$ are both trifluoromethyl ($CF_3$). Preferably, each fluorine-containing copolymer according to this invention has an absorption coefficient of less than 4.0 $\mu m^{-1}$ at a wavelength of 157 nm, preferably of less than 3.5 $\mu m^{-1}$ at this wavelength, and, more preferably, of less than 3.0 $\mu m^{-1}$ at this wavelength.

The fluorinated polymers, photoresists, and processes of this invention that include a fluoroalcohol functional group may have the structure:

-ZCH$_2$C(R$_f$)(R$_f'$)OH wherein $R_f$ and $R_f'$ are the same or different fluoroalkyl groups of from 1 to about 10 carbon atoms or taken together are $(CF_2)_n$ wherein n is 2 to 10; Z is selected from the group consisting of oxygen, sulfur, nitrogen, phosphorous, other Group VA element, and other Group VIA element. By the terms "other Group VA element" and "other Group VIA element", these terms are understood to mean herein any other element in one of these groups of the periodic table that is other than the recited elements (i.e., oxygen, sulfur, nitrogen, phosphorous) in these groups. Oxygen is the preferred Z group.

Some illustrative, but nonlimiting, examples of representative comonomers containing a fluoroalcohol functional group and within the scope of the invention are presented below:

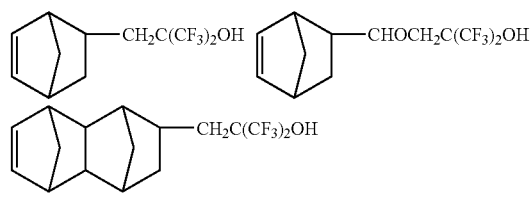

-continued

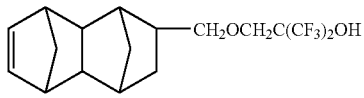

$CH_2=CHOCH_2CH_2OCH_2C(CF_3)_2OH$  $CH_2=CHO(CH_2)_4OCH_2C(CF_3)_2OH$

As is well known to those skilled in the polymer art, an ethylenically unsaturated compound undergoes free radical polymerization to afford a polymer having a repeat unit that is derived from the ethylenically unsaturated compound. Specifically, ethylenically unsaturated compound having structure:

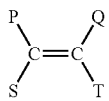

are described above with regard to copolymer (a1).

The fluoropolymer having at least one fluoroalcohol group (c) is selected from the group consisting of:

(c1) a fluorine-containing polymer comprising a repeat unit derived from at least one ethylenically unsaturated compound containing a fluoroalcohol functional group having the structure:

—$C(R_f)(R_f')OH$ wherein $R_f$ and $R_f'$ are as described above;

(c2) a fluorine-containing copolymer comprising a repeat unit derived from at least one ethylenically unsaturated compound characterized in that at least one ethylenically unsaturated compound is cyclic or polycyclic, at least one ethylenically unsaturated compound contains at least one fluorine atom covalently attached to an ethylenically unsaturated carbon atom, and at least one ethylenically unsaturated compound is comprised of a fluoroalcohol functional group having the structure:

—$C(R_f)(R_f')OH$ wherein $R_f$ and $R_f'$ are as described above;

(c3) a fluorine-containing copolymer comprising:
(i) a repeat unit derived from at least one ethylenically unsaturated compound containing at least three fluorine atoms covalently attached to two ethylenically unsaturated carbon atoms; and
(ii) a repeat unit derived from an ethylenically unsaturated compound comprised of a fluoroalcohol functional group having the structure:

—$C(R_f)(R_f')OH$ wherein $R_f$ and $R_f'$ are as described above.

(c4) a fluorine-containing copolymer comprising a repeat unit derived from at least one ethylenically unsaturated compound containing a fluoroalcohol functional group having the structure:

-$ZCH_2C(R_f)(R_f')OH$ wherein $R_f$ and $R_f'$ are as described above; and Z is an element selected from Group VA, and other Group VIA of the Periodic Table of the Elements (CAS Version). Typically X is a sulfur, oxygen, nitrogen or phosphorus atom;

(c5) a fluorine-containing polymer comprising the structure:

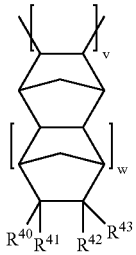

wherein each of $R^{40}$, $R^{41}$, $R^{42}$, and $R^{43}$ independently is hydrogen atom, a halogen atom, a hydrocarbon group containing from 1 to 10 carbon atoms, a hydrocarbon group substituted with at least one O, S, N, P or halogen and having 1 to 12 carbons atoms, for example, an alkoxy group, a carboxylic acid group, a carboxylic ester group or a functional group containing the structure:

—$C(R_f)(R_f')OR^{44}$ wherein $R_f$ and $R_f'$ are as describe above; $R^{44}$ is a hydrogen atom or an acid- or base-labile protecting group; v is the number of repeat units in the polymer; w is 0–4; at least one of the repeat units has a structure whereby at least one of $R^{40}$, $R^{41}$, $R^{42}$, and $R^{43}$ contains the structure $C(R_f)(R_f')OR^{44}$, for example, $R^{40}$, $R^{41}$, and $R^{42}$ are a hydrogen atom and $R^{43}$ is $CH_2OCH_2C(CF_3)_2OCH_2CO_2C(CH_3)_3$ wherein $CH_2CO_2C(CH_3)_3$ is an acid or base labile protecting group or $R^{43}$ is $OCH_2C(CF_3)_2OCH_2CO_2C(CH_3)_3$ wherein $OCH_2CO_2C(CH_3)_3$ is an acid or base labile protecting group; and (c6) a polymer comprising:
(i) a repeat unit derived from at least one ethylenically unsaturated compound containing a fluoroalcohol functional group having the structure:

—$C(R_f)(R_f')OH$ wherein $R_f$ and $R_f'$ areas described above; and
(ii) a repeat unit derived from at least one ethylenically unsaturated compound having the structure:

(H)($R^{45}$)C=C($R^{46}$)(CN)

wherein $R^{45}$ is a hydrogen atom or CN group; $R^{46}$ is $C_1$-$C_8$ alkyl group, hydrogen atom, or $CO_2R^{47}$ group, where $R^{47}$ is $C_1$-$C_8$ alkyl group or hydrogen atom.

The fluoropolymer or copolymer comprises a repeat unit (discussed infra) derived from at least one ethylenically unsaturated compound containing a fluoroalcohol functional group that can have fluoroalkyl groups present as part of the fluoroalcohol group and are described earlier with regard to copolymer (b). These fluoroalkyl groups are designated $R_f$ and $R_f'$ as described above.

As is well known to those skilled in the polymer art, an ethylenically unsaturated compound undergoes free radical polymerization to afford a polymer having a repeat unit that is derived from the ethylenically unsaturated compound. Specifically, an ethylenically unsaturated compound having structure:

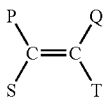

is described above with regard to copolymer (a1).

Each fluorine-containing copolymer according to this invention has an absorption coefficient of less than 4.0 µm$^{-1}$ at a wavelength of 157 nm, preferably of less than 3.5 µm$^{-1}$ at this wavelength, more preferably, of less than 3.0 µm$^{-1}$ at this wavelength, and, still more preferably, of less than 2.5 µm$^{-1}$ at this wavelength.

The fluorinated polymers, photoresists, and processes of this invention that include a fluoroalcohol functional group may have the structure:

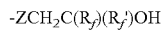

wherein $R_f$ and $R_f'$ are as described above; Z is as described above

Some illustrative, but nonlimiting, examples of representative comonomers containing a fluoroalcohol functional group and within the scope of the invention are presented below:

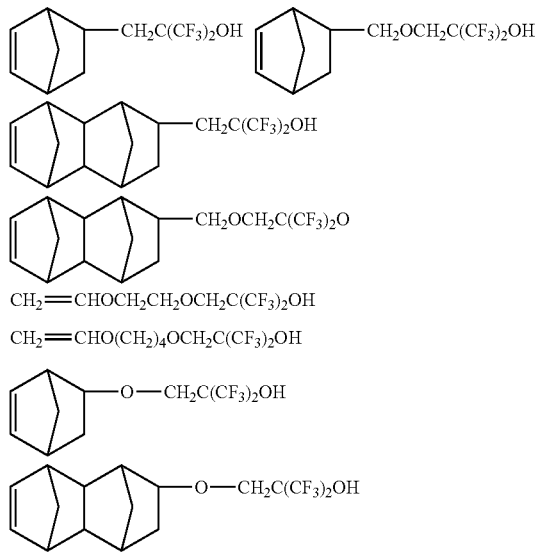

Various bifunctional compounds which can initially afford crosslinking and subsequently be cleaved (e.g., upon exposure to strong acid) are also useful as comonomers in the copolymers of this invention. As an illustrative, but non-limiting example, the bifunctional comonomer NB—F—OMOMO—F—NB is desirable as a comonomer in the copolymers of this invention. This and similar bifunctional comonomers, when present in the copolymer component(s) of photoresist compositions of this invention, can afford copolymers that are of higher molecular weight and are lightly crosslinked materials. Photoresist compositions, incorporating these copolymers comprised of bifunctional monomers, can have improved development and imaging characteristics, since, upon exposure (which photochemically generates strong acid as explained infra), there results cleavage of the bifunctional group and consequently a very significant drop in molecular weight, which factors can afford greatly improved development and imaging characteristics (e.g., improved contrast). These fluoroalcohol groups and their embodiments are described in more detail as above and in PCT/US00/11539 filed Apr. 28, 2000.

At least a portion of the nitrile functionality that is present in the nitrile/fluoroalcohol polymers results from incorporation of repeat unit(s) derived from at least one ethylenically unsaturated compound having at least one nitrile group and having the structure:

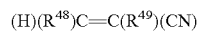

wherein $R^{48}$ is a hydrogen atom or cyano group (CN); $R^{49}$ is an alkyl group ranging from 1 to about 8 carbon atoms, $CO_2R^{50}$ group wherein $R^{50}$ is an alkyl group ranging from 1 to about 8 carbon atoms, or hydrogen atom. Acrylonitrile, methacrylonitrile, fumaronitrile (trans-1,2-dicyanoethylene), and maleonitrile (cis-1,2-dicyanoethylene) are preferred. Acrylonitrile is most preferred.

The nitrile/fluoroalcohol polymers typically are characterized in having a repeat unit derived from at least one ethylenically unsaturated compound containing the fluoroalcohol functional group that is present in the nitrile/fluoroalcohol polymers from about 10 to about 60 mole percent and a repeat unit derived from the at least one ethylenically unsaturated compound containing at least one nitrile group present in the polymer from about 20 to about 80 mole percent. The nitrile/fluoroalcohol polymers more typically with respect to achieving low absorption coefficient values are characterized in having a repeat unit derived from at least one ethylenically unsaturated compound containing the fluoroalcohol functional group that is present in the polymers at less than or equal to 45 mole percent, and, still more typically, at less than or equal to 30 mole percent with relatively small amounts of a repeat unit containing the nitrile group making at least a portion of the balance of the polymer.

In one embodiment, the polymer includes at least one protected functional group. The functional group of the at least one protected functional group is, typically, selected from the group consisting of acidic functional groups and basic functional groups. Nonlimiting examples of functional groups of the protected functional group are carboxylic acids and fluoroalcohols.

In another embodiment, a nitrile/fluoroalcohol polymer can include aliphatic polycyclic functionality. In this embodiment, the percentage of repeat units of the nitrile/fluoroalcohol polymer containing aliphatic polycyclic functionality ranges from about 1 to about 70 mole %; preferably from about 10 to about 55 mole %; and more typically ranges from about 20 to about 45 mole %.

The nitrile/fluoroalcohol polymers can contain additional functional groups beyond those specifically mentioned and referenced herein with the proviso that, preferably, aromatic functionality is absent in the nitrile/fluoroalcohol polymers. The presence of aromatic functionality in these polymers has been found to detract from their transparency and result in their being too strongly absorbing in the deep and extreme UV regions to be suitable for use in layers that are imaged at these wavelengths.

In some embodiments, the polymer is a branched polymer comprising one or more branch segment(s) chemically linked along a linear backbone segment. The branched polymer can be formed during free radical addition polymerization of at least one ethylenically unsaturated macromer component and at least one ethylenically unsaturated comonomer. The branched polymer may be prepared by any conventional addition polymerization process. The branched polymer, or comb polymer, may be prepared from one or more compatible ethylenically unsaturated macromer components and one or more compatible, conventional ethylenically unsaturated macromer components and one or more compatible, conventional ethylenically unsaturated monomer component(s). Typically addition polymerizable, ethylenically unsaturated monomer components are acrylonitrile, methacrylonitrile, fumaronitrile, maleonitrile, protected and/or unprotected unsaturated fluoroalcohols, and protected and/or unprotected unsaturated carboxylic acids. The structure and process of making this type of branched polymers is discussed for polymer type (b) above, and as described in WO 00/25178.

The fluoropolymers with at least one fluoroalcohol may further comprise a spacer group selected from the group consisting of ethylene, alpha-olefins, 1,1′-disubstituted olefins, vinyl alcohols, vinyl ethers, and 1,3-dienes.

Polymer (d) comprises an amorphous vinyl homopolymer of perfluoro(2,2-dimethyl-1,3-dioxole) or $CX_2=CY_2$ where $X=F$ or $CF_3$ and $Y=$—H or amorphous vinyl copolymer of perfluoro(2,2-dimethyl-1,3-dioxole) and $CX_2=CY_2$, said homopolymer or copolymer optionally containing one or more comonomer $CR^{51}R^{52}=CR^{53}R^{54}$ where each of the $R^{51}$, $R^{52}$, $R^{53}$ is selected independently from H or F and where $R^{54}$ is selected from the group consisting of —F, —$CF_3$, —$OR^{55}$ where $R^{55}$ is CnF2n+1 with n=1 to 3, —OH (when $R^{53}=H$), and Cl (when $R^{51}$, $R^{52}$, and $R^{53}=F$). Polymer (d) may additionally comprise amorphous vinyl copolymers of $CH_2=CHCF_3$ and $CF_2=CF_2$ in 1:2 to 2:1 ratio, $CH_2=CHF$ and $CF_2=CFCl$ in 1:2 to 2:1 ratio, $CH_2=CHF$ and $CClH=CF_2$ in 1:2 to 2:1 ratio, perfluoro(2-methylene-4-methyl-1,3-dioxolane) in any ratio with perfluoro(2,2-dimethyl-1,3-dioxole), perfluoro(2-methylene-4-methyl-1,3-dioxolane) in any ratio with vinylidene fluoride that is amorphous, and the homopolymer of perfluoro(2-methylene-4-methyl-1,3-dioxolane).

These polymers were made by polymerization methods known in the art for fluoropolymers. All of the polymers can be made by sealing the monomers, an inert fluid (such as $CF_2ClCCl_2F$, $CF_3CFHCFHCF_2CF_3$, or carbon dioxide), and a soluble free radical initiator such as HFPO dimer peroxide <u>1</u> or Perkadox® 16N in a chilled autoclave and then heating $$CF_3CF_2CF_2OCF(CF_3)(C=O)OO(C=O)CF(CF_3)OCF_2CF_2CF_3 \quad \underline{1}$$

as appropriate to initiate polymerization. For HFPO dimer peroxide <u>1</u> room temperature (~25° C.) is a convenient polymerization temperature whereas for Perkadox® temperatures from 60 to 90° C. can be used. Depending upon the monomers and the polymerization temperature, pressures can vary from atmospheric pressure to 500 psi or higher. The polymer can then be isolated by filtration when formed as an insoluble precipitate or by evaporation or precipitation when soluble in the reaction mixture. In many instances the apparently dry polymer still retains considerable solvent and/or unreacted monomer and must be dried further in a vacuum oven preferably under nitrogen bleed. Many of the polymers can also be made by aqueous emulsion polymerization effected by sealing deionized water, an initiator such as ammonium persulfate or Vazo® 56 WSP, monomers, a surfactant such as ammonium perfluorooctanoate or a dispersant such as methyl cellulose in a chilled autoclave and heating to initiate polymerization. The polymer can be isolated by breaking any emulsion formed, filtering, and drying. In all instances oxygen should be excluded from the reaction mixture. Chain transfer agents such as chloroform may be added to lower molecular weight.

A nitrile/fluoroalcohol-containing polymer prepared from the substituted or unsubstituted vinyl ethers (e) comprise:

(e1) a polymer comprising:
(i) a repeat unit derived from at least one ethylenically unsaturated compound comprising a vinyl ether functional group and having the structure:

$$CH_2=CHO—R^{56}$$

where $R^{56}$ is an alkyl group having 1 to 12 carbon atoms, aryl, aralkyl, or alkaryl group having from 6 to about 20 carbon atoms, or said groups substituted with a S, O, N or P atom; and (ii) a repeat unit derived from at least one ethylenically unsaturated compound having the structure:

$$(H)(R^{57})C=C(R^{58})(CN)$$

wherein $R^{57}$ is a hydrogen atom or cyano group; $R^{58}$ is an alkyl group ranging from 1 to about 8 carbon atoms, $CO_2R^{59}$ group wherein $R^{59}$ is an alkyl group ranging from 1 to about 8 carbon atoms, or hydrogen atom; and (iii) a repeat unit derived from at least one ethylenically unsaturated compound comprising an acidic group; and (e2) a polymer comprising:
(i) a repeat unit derived from at least one ethylenically unsaturated compound comprising a vinyl ether functional group and a fluoroalcohol functional group and having the structure:

$$C(R^{60})(R^{61})=C(R^{62})—O-D-C(R_f)(R_f')OH$$

wherein $R^{60}$, $R^{61}$, and $R^{62}$ independently are hydrogen atom, alkyl group ranging from 1 to about 3 carbon atoms; D is at least one atom that links the vinyl ether functional group through an oxygen atom to a carbon atom of the fluoroalcohol functional group; $R_f$ and $R_f'$ are as described above; and (ii) a repeat unit derived from at least one ethylenically unsaturated compound having the structure:

$$(H)(R^{57})C=C(R^{58})(CN)$$

wherein $R^{57}$ is a hydrogen atom or cyano group; $R^{58}$ is an alkyl group ranging from 1 to about 8 carbon atoms, $CO_2R^{59}$ group wherein $R^{59}$ is an alkyl group ranging from 1 to about 8 carbon atoms, or hydrogen atom; and (iii) a repeat unit derived from at least one ethylenically unsaturated compound comprising an acidic group.

The fluoroalcohol groups and embodiments are described in more detail for polymers (c6) above. Some illustrative, but nonlimiting, examples of vinyl ether monomers falling within the generalized structural formula (given supra) containing a fluoroalcohol functional group and within the scope of the invention are presented below:

$$CH_2=CHOCH_2CH_2OCH_2C(CF_3)_2OH \quad CH_2=CHO(CH_2)_4OCH_2C(CF_3)_2OH$$

The nitrile groups and their embodiments, and linear and branched polymers made with nitrile and fluoroalcohol groups and their embodiments, are also described and referenced in more detail for polymers (c6) above.

These polymers may be present in the amount of about 10 to about 99.5% by weight, based on the weight of the total composition (solids).

Process For Forming a Photoresist Image

The process for preparing a photoresist image on a substrate comprises, in order:

(X) imagewise exposing a photoresist element to form imaged and non-imaged areas, wherein the photoresist element comprises a substrate; an etch resistant layer; and at least one photoresist layer prepared from a photoresist composition comprising:
  (A) a polymer selected from (a)–(e) above, and mixtures thereof; and
  (B) a photoactive component; and
(Y) developing the exposed photoresist layer having imaged and non-imaged areas to form the relief image on the substrate.

Imagewise Exposure

The photoresist layer is prepared by applying a photoresist composition onto a substrate carrying an etch resistant layer and drying to remove the solvent. For example, the etch resistant layer is applied to the substrate by chemical vapor deposition (CVD). The so formed photoresist layer is sensitive in the ultraviolet region of the electromagnetic spectrum and especially to those wavelengths $\leq 365$ nm. Imagewise exposure of the resist compositions of this invention can be done at many different UV wavelengths including, but not limited to, 365 nm, 248 nm, 193 nm, 157 nm, and lower wavelengths. Imagewise exposure is preferably done with ultraviolet light of 248 nm, 193 nm, 157 nm, or lower wavelengths, preferably it is done with ultraviolet light of 193 nm, 157 nm, or lower wavelengths, and most preferably, it is done with ultraviolet light of 157 nm or lower wavelengths. Imagewise exposure can either be done digitally with a laser or equivalent device or non-digitally with use of a photomask. Digital imaging with a laser is preferred. Suitable laser devices for digital imaging of the compositions of this invention include, but are not limited to, an argon-fluorine excimer laser with UV output at 193 nm, a krypton-fluorine excimer laser with UV output at 248 nm, and a fluorine ($F_2$) laser with output at 157 nm. Since, as discussed supra, use of UV light of lower wavelength for imagewise exposure corresponds to higher resolution (lower resolution limit), the use of a lower wavelength (e.g., 193 nm or 157 m or lower) is generally preferred over use of a higher wavelength (e.g., 248 nm or higher).

Development

The components in the resist compositions of this invention must contain sufficient functionality for development following imagewise exposure to UV light. Preferably, the functionality is acid or protected acid such that aqueous development is possible using a basic developer such as sodium hydroxide solution, potassium hydroxide solution, or ammonium hydroxide solution.

For example, polymers (c) in the resist compositions of this invention are typically acid-containing materials comprised of at least one fluoroalcohol-containing monomer of structural unit:

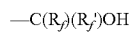

wherein $R_f$ and $R_f'$ are the same or different fluoroalkyl groups of from 1 to 10 carbon atoms or taken together are $(CF_2)_n$ wherein n is 2 to 10. The level of acidic fluoroalcohol groups is determined for a given composition by optimizing the amount needed for good development in aqueous alkaline developer.

When an aqueous processable photoresist is coated or otherwise applied to a substrate and imagewise exposed to UV light, development of the photoresist composition may require that the binder material should contain sufficient acid groups (e.g., fluoroalcohol groups) and/or protected acid groups that are at least partially deprotected upon exposure to render the photoresist (or other photoimageable coating composition) processable in aqueous alkaline developer. In case of a positive-working photoresist layer, the photoresist layer will be removed during development in portions which are exposed to UV radiation but will be substantially unaffected in unexposed portions during development by aqueous alkaline liquids such as wholly aqueous solutions containing 0.262 N tetramethylammonium hydroxide (with development at 25° C. usually for less than or equal to 120 seconds). In case of a negative-working photoresist layer, the photoresist layer will be removed during development in portions which are unexposed to UV radiation but will be substantially unaffected in exposed portions during development using either a critical fluid or an organic solvent.

A critical fluid, as used herein, is one or more substances heated to a temperature near or above its critical temperature and compressed to a pressure near or above its critical pressure. Critical fluids in this invention are at least at a temperature that is higher than 15° C. below the critical temperature of the fluid and are at least at a pressure higher than 5 atmosphers below the critical pressure of the fluid. Carbon dioxide may be used for the critical fluid in the present invention. Various organic solvents can also be used as developer in this invention. These include, but are not limited to, halogenated solvents and non-halogenated solvents. Halogenated solvents are typical and fluorinated solvents are more typical.

The etch resistant layer may be developed by any know conventional means. For example, the pattern of the resist layer may be transferred to the etch resistant layer by anisotropically etching the exposed areas of the etch resistant layer.

What is claimed is:

1. A photoresist element comprising:
  (L) a substrate;
  (M) an etch resistant layer; and
  (N) at least one photoresist layer prepared from a photoresist composition comprising
  (A) at least one polymer selected from the group consisting of:
    (a) a fluorine-containing copolymer comprising a repeat unit derived from at least one ethylenically unsaturated compound characterized in that the at least one ethylenically unsaturated compound is polycyclic and at least one ethylenically unsaturated compound contains at least one fluorine atom covalently attached to an ethylenically unsaturated carbon atom, and the copolymer further comprises carboxylic acid groups or protected acid groups;
    (b) a fluorine-containing copolymer comprising a repeat unit derived from at least one polycyclic ethylenically unsaturated compound having at least one atom or group selected from the group consisting of fluorine atom, perfluoroalkyl group, and perfluoroalkoxy group, characterized in that the at least one atom or group is covalently attached to a carbon atom which is contained within a ring structure and separated from each ethylenically unsaturated carbon atom of the ethylenically unsaturated compound by at least one covalently attached carbon atom, and the copolymer further comprises carboxylic acid groups or protected acid groups;

(c) a fluorine-containing copolymer comprising a repeat unit derived from at least one ethylenically unsaturated compound characterized in that at least one ethylenically unsaturated compound is cyclic or polycyclic, at least one ethylenically unsaturated compound contains at least one fluorine atom covalently attached to an ethylenically unsaturated carbon atom, and at least one ethylenically unsaturated compound is comprised of a fluoroalcohol functional group having the structure:

—C($R_f$)($R_{f'}$)OH wherein $R_f$ and $R_{f'}$ are the same or different fluoroalkyl groups of from 1 to about 10 carbon atoms or taken together are $(CF_2)_n$ wherein n is 2 to 10;

(d) a fluorine-containing copolymer comprising:
  (i) a repeat unit derived from at least one ethylenically unsaturated compound containing at least three fluorine atoms covalently attached to two ethylenically unsaturated carbon atoms; and
  (ii) a repeat unit derived from an ethylenically unsaturated compound comprised of a fluoroalcohol functional group having the structure:

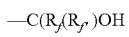
—C($R_f$)($R_{f'}$)OH wherein $R_f$ and $R_{f'}$ are the same or different fluoroalkyl groups of from 1 to about 10 carbon atoms or taken together are $(CF_2)_n$ wherein n is 2 to 10; and (e) a fluorine-containing polymer comprising the structure:

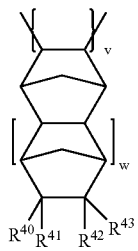

wherein each of $R^{40}$, $R^{41}$, $R^{42}$, and $R^{43}$ independently is a hydrogen atom, a halogen atom, a hydrocarbon group containing from 1 to 10 carbon atoms, a substituted hydrocarbon group, an alkoxy group, a carboxylic acid, a carboxylic ester or a functional group containing the structure:

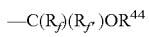
—C($R_f$)($R_{f'}$)O$R^{44}$ wherein $R_f$ and $R_{f'}$ are the same or different fluoroalkyl groups of from 1 to 10 carbon atoms or taken together are $(CF_2)_n$ wherein n is 2 to 10; $R^{44}$ is a hydrogen atom or an acid- or base-labile protecting group; v is the number of repeat units in the polymer; w is 0–4; at least one of the repeat units has a structure whereby at least one of $R^{40}$, $R^{41}$, $R^{42}$, and $R^{43}$ contains the structure C($R_f$)($R_{f'}$)O$R^{44}$; and (B) at least one photoactive component that is chemically bonded to the polymer selected from the group consisting of (a) to (e).

2. The photoresist element of claim 1 wherein the polymer has an absorption coefficient of less than about 5.0 μm$^{-1}$ at a wavelength of about 157 nm.

3. The photoresist element of claim 1 wherein the polymer (c), (d) or (e) further comprises a spacer group selected from the group consisting of ethylene, alpha-olefins, 1,1'-disubstituted olefins, vinyl alcohols, vinyl ethers, and 1,3-dienes.

4. The photoresist element of claim 1 wherein the photoresist composition further comprises a solvent.

5. The photoresist element of claim 1 wherein the substrate is selected from the group consisting of silicon, silicon oxide, and silicon nitride, and mixtures thereof.

6. The photoresist element of claim 1 wherein the etch resistant layer is an inorganic material.

7. The photoresist element of claim 1 wherein the inorganic material is selected from the group consisting of silicon oxide, silicon nitride, silicon oxynitride, and mixtures thereof.

8. A process for preparing a photoresist image on a substrate comprising, in order:

(X) imagewise exposing a photoresist element to form imaged and non-imaged areas, wherein the photoresist element comprises a substrate; an etch resistant layer; and at least one photoresist layer prepared from a photoresist composition comprising:

(A) at least one polymer selected from the group consisting of:
  (a) a fluorine-containing copolymer comprising a repeat unit derived from at least one ethylenically unsaturated compound characterized in that the at least one ethylenically unsaturated compound is polycyclic and at least one ethylenically unsaturated compound contains at least one fluorine atom covalently attached to an ethylenically unsaturated carbon atom, and the copolymer further comprises carboxylic acid groups or protected acid groups;
  (b) a fluorine-containing copolymer comprising a repeat unit derived from at least one polycyclic ethylenically unsaturated compound having at least one atom or group selected from the group consisting of fluorine atom, perfluoroalkyl group, and perfluoroalkoxy group, characterized in that the at least one atom or group is covalently attached to a carbon atom which is contained within a ring structure and separated from each ethylenically unsaturated carbon atom of the ethylenically unsaturated compound by at least one covalently attached carbon atom, and the copolymer further comprises carboxylic acid groups or protected acid groups;
  (c) a fluorine-containing copolymer comprising a repeat unit derived from at least one ethylenically unsaturated compound characterized in that at least one ethylenically unsaturated compound is cyclic or polycyclic, at least one ethylenically unsaturated compound contains at least one fluorine atom covalently attached to an ethylenically unsaturated carbon atom, and at least one ethylenically unsaturated compound is comprised of a fluoroalcohol functional group having the structure:

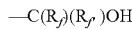
—C($R_f$)($R_{f'}$)OH wherein $R_f$ and $R_{f'}$ are the same or different fluoroalkyl groups of from 1 to about 10 carbon atoms or taken together are $(CF_2)_n$ wherein n is 2 to 10;

(d) a fluorine-containing copolymer comprising:
    (i) a repeat unit derived from at least one ethylenically unsaturated compound containing at least three fluorine atoms covalently attached to two ethylenically unsaturated carbon atoms; and (ii) a repeat unit derived from an ethylenically unsaturated compound comprised of a fluoroalcohol functional group having the structure:

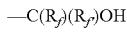

wherein $R_f$ and $R_{f'}$ are the same or different fluoroalkyl groups of from 1 to about 10 carbon atoms or taken together are $(CF_2)_n$ wherein n is 2 to 10; and (e) a fluorine-containing polymer comprising the structure:

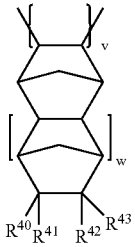

wherein each of $R^{40}$, $R^{41}$, $R^{42}$, and $R^{43}$ independently is a hydrogen atom, a halogen atom, a hydrocarbon group containing from 1 to 10 carbon atoms, a substituted hydrocarbon group, an alkoxy group, a carboxylic acid, a carboxylic ester or a functional group containing the structure:

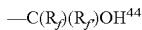

wherein $R_f$ and $R_{f'}$ are the same or different fluoroalkyl groups of from 1 to 10 carbon atoms or taken together are $(CF_2)_n$ wherein n is 2 to 10; $R^{44}$ is a hydrogen atom or an acid- or base-labile protecting group; v is the number of repeat units in the polymer; w is 0–4; at least one of the repeat units has a structure whereby at least one of $R^{40}$, $R^{41}$, $R^{42}$, and $R^{43}$ contains the structure $C(R_f)(R_{f'})OH^{44}$; and (B) a photoactive component that is chemically bonded to the polymer selected from the group consisting of (a) to (e); and (Y) developing the exposed photoresist layer having imaged and non-imaged areas to form the relief image on the substrate.

9. The process of claim 8 wherein the polymer has an absorption coefficient of less than about 5.0 $\mu m^{-1}$ at a wavelength of about 157 nm.

10. The process of claim 8 wherein the etch resistant layer is selected from the group consisting of silicon oxide, silicon nitride, silicon oxynitride, and mixtures thereof.

11. A photoresist element comprising:
(L) a substrate;
(M) an etch resistant layer, wherein the etch resistant layer is an inorganic material; and
(N) at least one photoresist layer prepared from a photoresist composition comprising:
(A) at least one polymer selected from the group consisting of:
(a) fluorine-containing copolymer comprising a repeat unit derived from at least one polycyclic ethylenically unsaturated compound having at least one atom or group selected from the group consisting of fluorine atom, perfluoroalkyl group, and perfluoroalkoxy group, characterized in that the at least one atom or group is covalently attached to a carbon atom which is contained within a ring structure and separated from each ethylenically unsaturated carbon atom of the ethylenically unsaturated compound by at least one covalently attached carbon atom, and the copolymer further comprises carboxylic acid groups or protected acid groups;

(b) a fluorine-containing polymer comprising the structure:

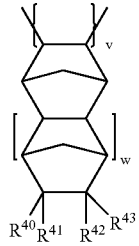

wherein each of $R^{40}$, $R^{41}$, $R^{42}$, and $R^{43}$ independently is a hydrogen atom, a halogen atom, a hydrocarbon group containing from 1 to 10 carbon atoms, a substituted hydrocarbon group, an alkoxy group, a carboxylic acid, a carboxylic ester or a functional group containing the structure:

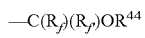

wherein $R_f$ and $R_{f'}$ are the same or different fluoroalkyl groups of from 1 to 10 carbon atoms or taken together are $(CF_2)_n$ wherein n is 2 to 10; $R^{44}$ is a hydrogen atom or an acid- or base-labile protecting group; v is the number of repeat units in the polymer; w is 0–4; at least one of the repeat units has a structure whereby at least one of $R^{40}$, $R^{41}$, $R^{42}$, and $R^{43}$ contains the structure $C(R_f)(R_{f'})OR^{44}$; and (B) at least one photoactive component.

12. The photoresist element of claim 11 wherein the polymer has an absorption coefficient of less than about 5.0 $\mu m-1$ at a wavelength of about 157 nm.

13. The photoresist element of claim 11 wherein the polymer (b) further comprises a spacer group selected from the group consisting of ethylene, alpha-olefins, 1,1'-disubstituted olefins, vinyl alcohols, vinyl ethers, and 1,3-clients.

14. The photoresist element of claim 11 wherein the photoresist composition further comprises a solvent.

15. The photoresist element of claim 11 wherein the substrate is selected from the group consisting of silicon, silicon oxide, and silicon nitride, and mixtures thereof.

16. The photoresist element of claim 11 wherein the inorganic material is selected from the group consisting of silicon oxide, silicon nitride, silicon oxynitride, and mixtures thereof.

17. A process for preparing a photoresist image on a substrate comprising, in order:
(X) imagewise exposing a photoresist element to form imaged and non-imaged areas, wherein the photoresist element comprises a substrate; an etch resistant layer comprising an inorganic material; and at least one photoresist layer prepared from a photoresist composition comprising:
(A) at least one polymer selected from the group consisting of:
(a) a fluorine-containing copolymer comprising a repeat unit derived from at least one polycyclic ethylenically unsaturated compound having at least one atom or group selected from the group consisting of fluorine atom, perfluoroalkyl group, and perfluoroalkoxy group, characterized in that the at least one atom or group is covalently attached to a carbon atom which is contained within a ring structure and separated from each ethylenically unsaturated carbon atom of the ethylenically unsaturated compound by at least one covalently attached carbon atom, and the copolymer further comprises carboxylic acid groups or protected acid groups;

(b) a fluorine-containing polymer comprising the structure:

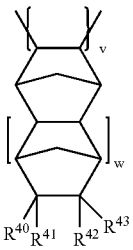

wherein each of $R^{40}$, $R^{41}$, $R^{42}$, and $R^{43}$ independently is a hydrogen atom, a halogen atom, a hydrocarbon group containing from 1 to 10 carbon atoms, a substituted hydrocarbon group, an alkoxy group, a carboxylic acid, a carboxylic ester or a functional group containing the structure:

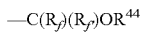

wherein $R_f$ and $R_{f'}$ are the same or different fluoro2lkyl groups of from 1 to 10 carbon atoms or taken together are $(CF_2)_n$ wherein n is 2 to 10; $R^{44}$ is a hydrogen atom or an acid- or base-labile protecting group; v is the number of repeat units in the polymer; w is 0–4; at least one of the repeat units has a structure whereby at least one of $R^{40}$, $R^{41}$, $R^{42}$, and $R^{43}$ contains the structure $C(R_f)(R_{f'})OR^{44}$; and (B) a photoactive component; and (Y) developing the exposed photoresist layer having imaged and non-imaged areas to form the relief image on the substrate.

18. The process of claim 17 wherein the polymer has an absorption coefficient of less than about 5.0 $\mu m^{-1}$ at a wavelength of about 157 nm.

19. The process of claim 17 wherein the etch resistant layer is selected from the group consisting of silicon oxide, silicon nitride, silicon oxynitride, and mixtures thereof.

20. A photoresist element comprising:
(L) a substrate;
(M) an etch resistant layer; and
(N) at least one photoresist layer prepared from a photoresist composition comprising:
(A) a fluorine-containing polymer comprising the structure:

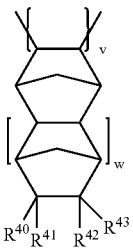

wherein each of $R^{40}$, $R^{41}$, $R^{42}$, and $R^{43}$ independently is a hydrogen atom, a halogen atom, a hydrocarbon group containing from 1 to 10 carbon atoms, a substituted hydrocarbon group, an alkoxy group, a carboxylic acid, a carboxylic ester or a functional group containing the structure:

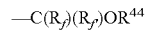

wherein $R_f$ and $R_{f'}$ are the same or different fluoroalkyl groups of from 1 to 10 carbon atoms or taken together are $(CF_2)_a$ wherein a is 2 to 10; $R^{44}$ is a hydrogen atom or an acid- or base-labile protecting group; v is the number of repeat units in the polymer; w is 0–4; at least one of the repeat units has a structure whereby at least one of $R^{40}$, $R^{41}$, $R^{42}$, and $R^{43}$ contains the structure $C(R_f)(R_{f'})OR^{44}$; and (B) at least one photoactive component.

21. The photoresist element of claim 20 wherein polymer (A) further comprises a spacer group selected from the group consisting of ethylene, alpha-olefins, 1,1'-disubstituted olefins, vinyl alcohols, vinyl ethers, and 1,3-dienes.

22. The photoresist element of claim 20 wherein the photoresist composition further comprises a solvent.

23. The photoresist element of claim 20 wherein the substrate is selected from the group consisting of silicon, silicon oxide, and silicon nitride, and mixtures thereof.

24. A process for preparing a photoresist image on a substrate comprising, in order:

(X) imagewise exposing a photoresist element to form imaged and non-imaged areas, wherein the photoresist element comprises a substrate; an etch resistant layer; and at least one photoresist layer prepared from a photoresist composition comprising:

(A) a fluorine-containing polymer comprising the structure:

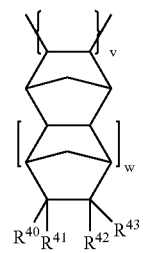

wherein each of $R^{40}$, $R^{41}$, $R^{42}$, and $R^{43}$ independently is a hydrogen atom, a halogen atom, a hydrocarbon group containing from 1 to 10 carbon atoms, a substituted hydrocarbon group, an alkoxy group, a carboxylic acid, a carboxylic ester or a functional group containing the structure:

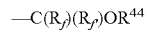

wherein $R_f$ and $R_{f'}$ are the same or different fluoroalkyl groups of from 1 to 10 carbon atoms or taken together are $(CF_2)_n$ wherein n is 2 to 10; $R^{44}$ is a hydrogen atom or an acid- or base-labile protecting group; v is the number of repeat units in the polymer; w is 0–4; at least one of the repeat units has a structure whereby at least one of $R^{40}$, $R^{41}$, $R^{42}$, and $R^{43}$ contains the stinctare $C(R_f)(R_{f'})OR^{44}$; and (B) a photoactive component; and (Y) developing the exposed photoresist layer having imaged and non-imaged areas to form the relief image on the substrate.

* * * * *